United States Patent
Thomas et al.

(10) Patent No.: US 11,754,599 B2
(45) Date of Patent: Sep. 12, 2023

(54) PRECISION DYNAMIC RANGE EXPANSION FOR CURRENT MEASUREMENT

(71) Applicant: Analog Devices, Inc., Wilmington, MA (US)

(72) Inventors: Andrew Joseph Thomas, Arlington, MA (US); Joseph L. Sousa, Billerica, MA (US); Micah Galletta O'Halloran, Andover, MA (US); Alex Robert Sloboda, Andover, MA (US)

(73) Assignee: Analog Devices, Inc., Wilmington, MA (US)

( * ) Notice: Subject to any disclaimer, the term of this patent is extended or adjusted under 35 U.S.C. 154(b) by 33 days.

(21) Appl. No.: 17/376,850

(22) Filed: Jul. 15, 2021

(65) Prior Publication Data

US 2023/0013695 A1 Jan. 19, 2023

(51) Int. Cl.
G01R 19/00 (2006.01)
G01R 19/22 (2006.01)
G01R 19/165 (2006.01)

(52) U.S. Cl.
CPC ... G01R 19/0092 (2013.01); G01R 19/16523 (2013.01); G01R 19/22 (2013.01); H03F 2200/222 (2013.01)

(58) Field of Classification Search
CPC .......... G01R 19/0092; G01R 19/16523; G01R 19/22
See application file for complete search history.

(56) References Cited

U.S. PATENT DOCUMENTS

| | | | |
|---|---|---|---|
| 5,880,827 A | 3/1999 | Heinke | |
| 6,140,878 A | 10/2000 | Masuta | |
| 7,825,735 B1 * | 11/2010 | Wessendorf | H03F 3/08 |
| | | | 330/308 |
| 8,346,100 B2 | 1/2013 | Cerisola et al. | |
| 10,333,425 B1 | 6/2019 | Heath et al. | |
| 10,680,715 B1 | 6/2020 | Nuttgens et al. | |

(Continued)

FOREIGN PATENT DOCUMENTS

| | | |
|---|---|---|
| CN | 112564652 A | 3/2021 |
| WO | WO-2007033119 A2 | 3/2007 |
| WO | WO-2019180091 A1 | 9/2019 |

OTHER PUBLICATIONS

"IVC102: Precision Switched Integrator Transimpedance Amplifier", Burr-Brown Data Sheet, (2006), 12 pgs.

(Continued)

*Primary Examiner* — Dominic E Hawkins
(74) *Attorney, Agent, or Firm* — Schwegman Lundberg & Woessner, P.A.

(57) ABSTRACT

A measurement circuit comprises an input terminal to receive a current signal, a first circuit branch coupled to the first terminal and including one or more circuit elements to receive a portion of the current signal, a second circuit branch coupled to the first terminal and including one or more additional circuit elements to receive another portion of the current signal, a nonlinear circuit element coupling the first circuit branch to the second circuit branch, and a quantization circuit configured to produce an input current measurement of current in the first and second circuit branches, and to include current in the second circuit branch in the input current measurement according to a magnitude of the input current signal.

18 Claims, 5 Drawing Sheets

(56) References Cited

U.S. PATENT DOCUMENTS

| | | | |
|---|---|---|---|
| 2003/0001671 A1* | 1/2003 | Schemmann | H03F 1/3276 330/149 |
| 2014/0210568 A1* | 7/2014 | Huijzer | H03F 1/565 333/32 |
| 2017/0201270 A1* | 7/2017 | Nittala | H03M 1/1009 |
| 2019/0253030 A1 | 8/2019 | Eken | |
| 2019/0383732 A1 | 12/2019 | Weilguni | |
| 2020/0393365 A1 | 12/2020 | Pierson et al. | |
| 2022/0099712 A1* | 3/2022 | De Fazio | H02M 1/0009 |

OTHER PUBLICATIONS

"Precision, High-Speed Transimpedance Amplifier", Burr-Brown Data Sheet, (Sep. 2007), 24 pgs.

Orozco, Luis, "Optimizing Precision Photodiode Sensor Circuit Design", Analog Devices, (2014), 5 pgs.

\* cited by examiner

PRECISION DYNAMIC RANGE EXPANSION FOR CURRENT MEASUREMENT

FIELD OF THE DISCLOSURE

This document relates to electronic circuits to measure analog electrical signals and in particular to reducing the errors in measuring the signals.

BACKGROUND

Electronic circuits can be used to measure electrical signals. It is sometimes desired to measure an electrical signal with precision, such as by using an analog-to-digital converter (ADC) circuit. However, the signal to be monitored may have a wide amplitude range such as a large voltage or current span, making it difficult to measure the signal with conventional precision ADC circuits.

SUMMARY OF THE DISCLOSURE

This document relates generally to circuits to measure an analog signal, such as an analog current signal or analog voltage signal, having a magnitude greater than what the available measurement circuits can measure without error. In some aspects, a measurement circuit includes an input terminal to receive a current signal, a first circuit branch coupled to the first terminal and including one or more circuit elements to receive a portion of the current signal, a second circuit branch coupled to the first terminal and including one or more additional circuit elements to receive another portion of the current signal, a nonlinear circuit element coupling the first circuit branch to the second circuit branch, and a quantization circuit configured to produce an input current measurement of current in the first and second circuit branches, and to include current in the second circuit branch in the input current measurement according to a magnitude of the input current signal.

In some aspects, a method of measuring an analog electrical signal includes dividing the input current signal between a first circuit branch and a second circuit branch, the first circuit branch connected to the second circuit branch by a nonlinear circuit element, quantizing a value of current in the first circuit branch and quantizing a value of current in the second current branch, and producing an input current measurement of the input current signal using the quantized value of current in the first circuit branch and including the quantized value of current in the second current branch according to a magnitude of the input current signal.

In some aspects, an electronic system includes a TIA circuit to receive an input signal to be quantized, and a first ADC circuit and a second ADC circuit to quantize the input signal. The system also includes multiple feedback paths connected between an output of the TIA circuit and an input of the TIA circuit, including a first circuit branch that includes a first impedance and a second circuit branch that includes a second impedance connected in series with a nonlinear circuit element. The nonlinear circuit element sets a signal gain of the TIA circuit according to a magnitude of the input signal. The output of the second ADC circuit is selectively summed with the output of the first ADC circuit to quantize the input signal based on a magnitude of the input signal.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

An electrical analog signal with a large voltage or current range may be difficult to measure using conventional measurement circuits that may not be designed to measure a signal with a large voltage or current span. An example is an optical signal chain used to measure the current output of a photodiode. The current signal from a photodiode can have a large dynamic range.

Figure 1:
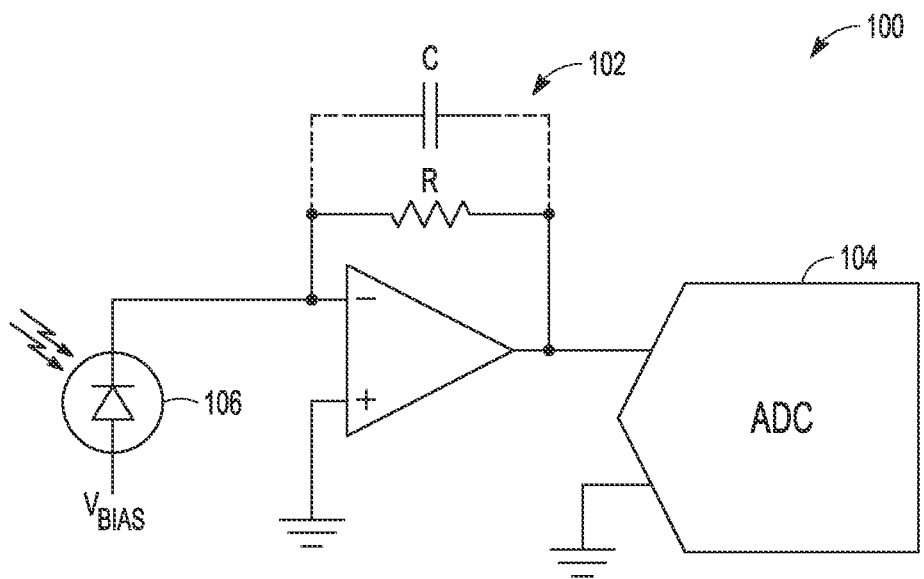
FIG. 1 is an example of a measurement circuit to measure the current output of a photodiode.

FIG. 1 is a schematic of an example of a measurement circuit 100 to measure the current output of a photodiode. The measurement circuit 100 includes a transimpedance amplifier (TIA) circuit 102 and an analog-to-digital converter (ADC) circuit 104. The TIA circuit 102 includes a feedback path that includes a resistive impedance (e.g., a resistor R). The feedback path can optionally include a capacitor C to stabilize the TIA circuit 102 and provide low pass filtering.

The photodiode 106 can be a high-dynamic-range current signal source in which the noise floor of the decreases as the magnitude of the signal decreases. The circuit noise of the measurement circuit 100 at small signal levels is dominated by the signal-independent noise terms of the resistance R, TIA circuit 102, and ADC circuit 104, all of which can be improved by increasing the value of the resistance R in the feedback. However, the value of resistance in the feedback also determines the maximum signal range because the TIA circuit 102 has finite supply voltages and the ADC circuit 104 has a finite input range, which therefore determines the dynamic range of measurements by the measurement circuit 100. A TIA circuit 102 with a higher circuit supply (and an ADC circuit or ADC system with higher input range) may be used to increase the dynamic range, but this will generally require trading off power, speed, noise, etc.

Figure 2:
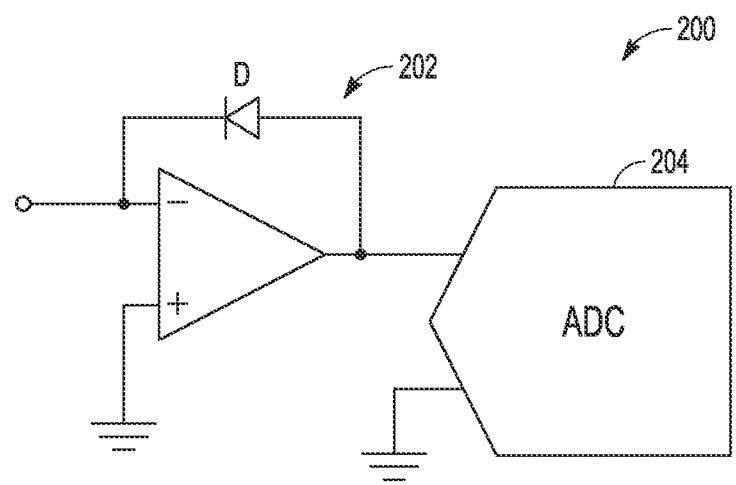
FIG. 2 is a schematic of an example of a measurement circuit to measure a signal with a large dynamic range.

FIG. 2 is a schematic of another example of a measurement circuit 200 to measure a signal with a large dynamic range. The measurement circuit 200 includes a TIA circuit 202 and an ADC circuit 204. The example of FIG. 2 improves the dynamic range limit of the measurement circuit 200 by using a nonlinear impedance to reduce the incremental gain of the TIA circuit 202. In this example, the nonlinear impedance is the diode D, and this feedback for the amplifier produces a logarithmic amplifier. Because of the logarithmic response, the gain of the TIA circuit 202 decreases as the amplitude of the input signal to be measured increases. However, it is difficult to obtain precision measurement results with the approach of FIG. 2 because the preciseness of the output heavily depends on the exact characteristics of the non-linearity, which are generally highly variable with temperature, process, etc., and cause the result to be highly variable.

Figure 3:
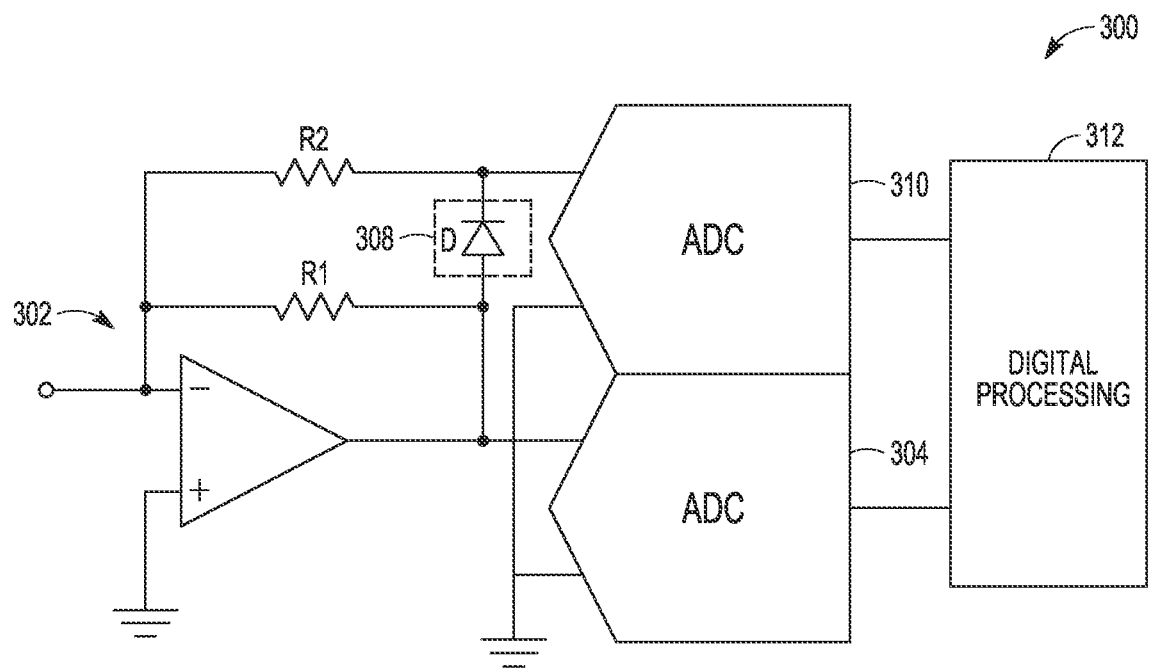
FIG. 3 is a schematic of another example of a measurement circuit to measure a signal with a large dynamic range.

FIG. 3 is a schematic of another example of a measurement circuit 300 to measure a signal with a large dynamic range. The input terminal may be connected to a photodiode as in the example of FIG. 1 or the measurement circuit 300 can be used to measure an input signal from another high-dynamic-range signal source. In the example of FIG. 3, the input signal is measured using multiple measurement channels. The measurements of the channels are combined to produce a composite measurement.

The measurement circuit 300 includes multiple circuit branches that each include one or more circuit elements that receive an input current signal for measurement. In the example of FIG. 3, one circuit branch includes resistor R1 and a second circuit branch includes resistor R2. The input current is divided between the circuit branches. In variations, the measurement circuit can include more than two circuit branches. A nonlinear circuit element 308 connects the two circuit branches. In the example of FIG. 3, the nonlinear circuit element is diode D.

The measurement circuit 300 includes current-to-voltage converting network 302 that converts the input current to a voltage for measurement. The current-to-voltage converting network includes an amplifier (e.g., a TIA) connected to the input terminal, the first circuit branch and the nonlinear circuit element 308.

For small input signals having an amplitude too small to turn on diode D, the feedback of the amplifier includes resistor R1 and does not include resistor R2. This provides a high-gain signal path. The measurement circuit 300 includes a quantization circuit comprised of two ADC circuits 304 and 310 or two ADC channels. When the input signal is small, the amplifier has higher signal gain. ADC circuit 304 is used to quantize the higher gain signal on the first circuit branch.

When the input signal has an amplitude sufficient to forward bias diode D, the feedback of the amplifier changes to include the R1 resistor, the diode, and the R2 resistor. This includes the incremental resistance R2 in the amplifier feedback to provide a low-gain signal path. When the magnitude of the input signal is large enough to change the feedback for lower signal gain, ADC circuit 310 is used to quantize the signal on the low-gain second circuit branch in addition to the quantization by ADC circuit 304 of the high gain first circuit branch. All of the current of the input signal must flow through one of the two resistors. This means that the sum of the outputs of the two ADCs (with appropriate scaling for known resistor values) is exactly the input current, regardless of the nature of the nonlinearity of the diode D, which only determines how much current flows in each resistor.

When the input signal is small, the top ADC circuit 310 is not converting any real signal, only the thermal noise of the top resistor R2. Therefore, the output of the ADC circuit 310 may be excluded from the sum. This lowers the noise floor to that of an amplifier circuit having only the lower resistor R1. The condition of when the input signal is too small to activate the diode D can be determined from the ADC outputs. For instance, that the amplitude of the input signal is large enough to activate the diode can be determined when the output of the bottom ADC circuit 304 exceeds a threshold that would forward bias the diode. When the threshold is exceeded, the output of the top ADC circuit 310 is included in the sum.

The summing of the outputs of the ADC channels can be controlled by digital processing circuitry 312. The digital processing circuitry can include a processor, field programmable gate array, application specific integrated circuit, or other logic circuitry to control the summation of the quantization by the ADC channels. The digital processing circuitry 312 may change the threshold used to trigger summation based on operating characteristics (e.g., operating temperature) of the measurement circuit. The top ADC circuit 310 may have a high input impedance buffer, or both the top and bottom ADC circuits may have buffered inputs.

Figure 4:
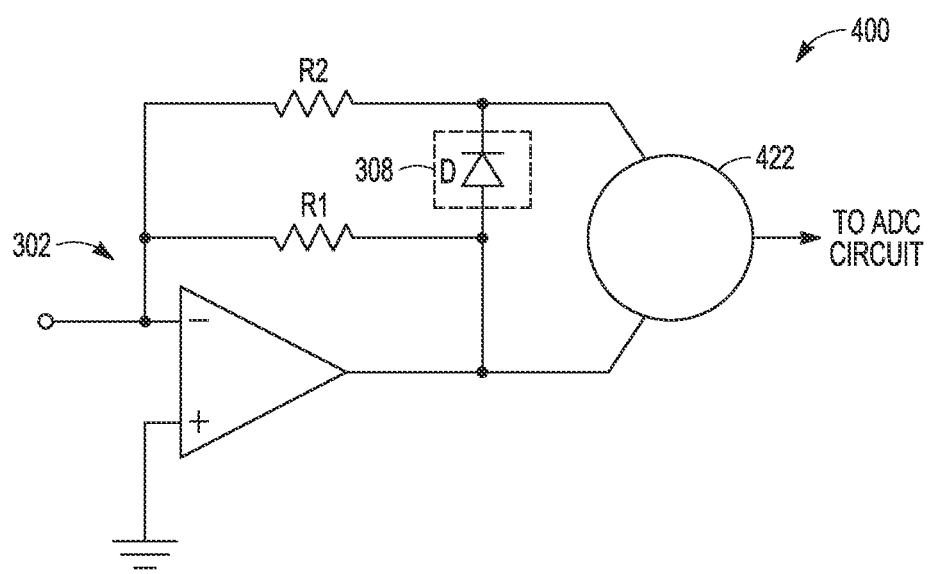
FIG. 4 is a schematic of portions of still another example of a measurement circuit to measure a signal with a large dynamic range.
Figure 9:
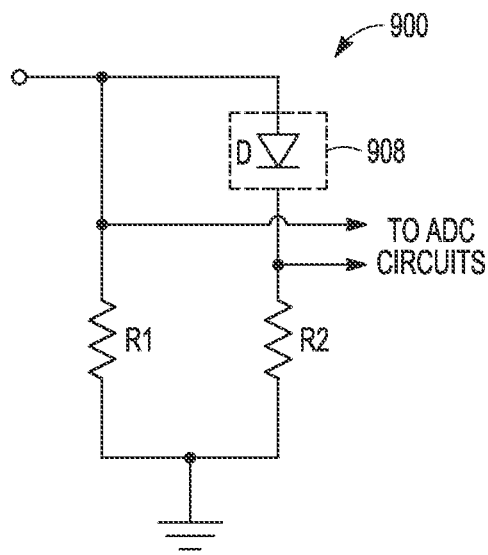
FIG. 9 is a schematic of portions of another example of a measurement circuit to measure a signal with a large dynamic range.

FIG. 4 is a schematic of portions of another example of a measurement circuit 400 to measure a signal with a large dynamic range. In the approach of FIG. 4, selective summing of the first circuit branch and the second circuit branch occurs before quantizing. The measurement circuit 400 includes a summing circuit 422 that receives a signal from the first circuit branch and a signal from the second circuit branch as inputs. Depending on the magnitude of the input signal, the output of the summing circuit is either a measurement of the signal of the first circuit branch or the sum of the signal from the first circuit branch and the signal from the second circuit branch. A comparator (not shown) can be used to select the summing option when the input signal exceeds a threshold voltage. The output of the summing circuit 422 is quantized by an ADC circuit. Only one ADC circuit is needed to quantize the combined signal. FIG. 9 is a schematic of portions of another example of a measurement circuit 900. The measurement circuit 900 includes nonlinear circuit element 908 and does not include an amplifier.

Returning to FIG. 3, although the operation of the measurement circuit 300 does not depend on the exact characteristics of the nonlinearity, the nonlinear circuit element (e.g., diode D) should have certain properties. For instance, the nonlinearity should be fairly "sharp" so that there is a region where the conductivity of the nonlinear circuit is very small compared to the conductivity of the bottom resistor R1 (subject to the desired precision). There should also be a relatively small parasitic capacitance in the nonlinear circuit element, so that there is no substantial high-frequency conduction through the top high-gain signal path.

In the example of FIG. 3, diode D can be a discrete diode, but other options can be used for the nonlinear circuit element 308. In some examples, the nonlinear circuit element 308 is a metal oxide semiconductor field effect transistor (MOSFET) connected in a diode configuration with the drain or source region of the MOSFET connected to the gate region.

Figure 5:
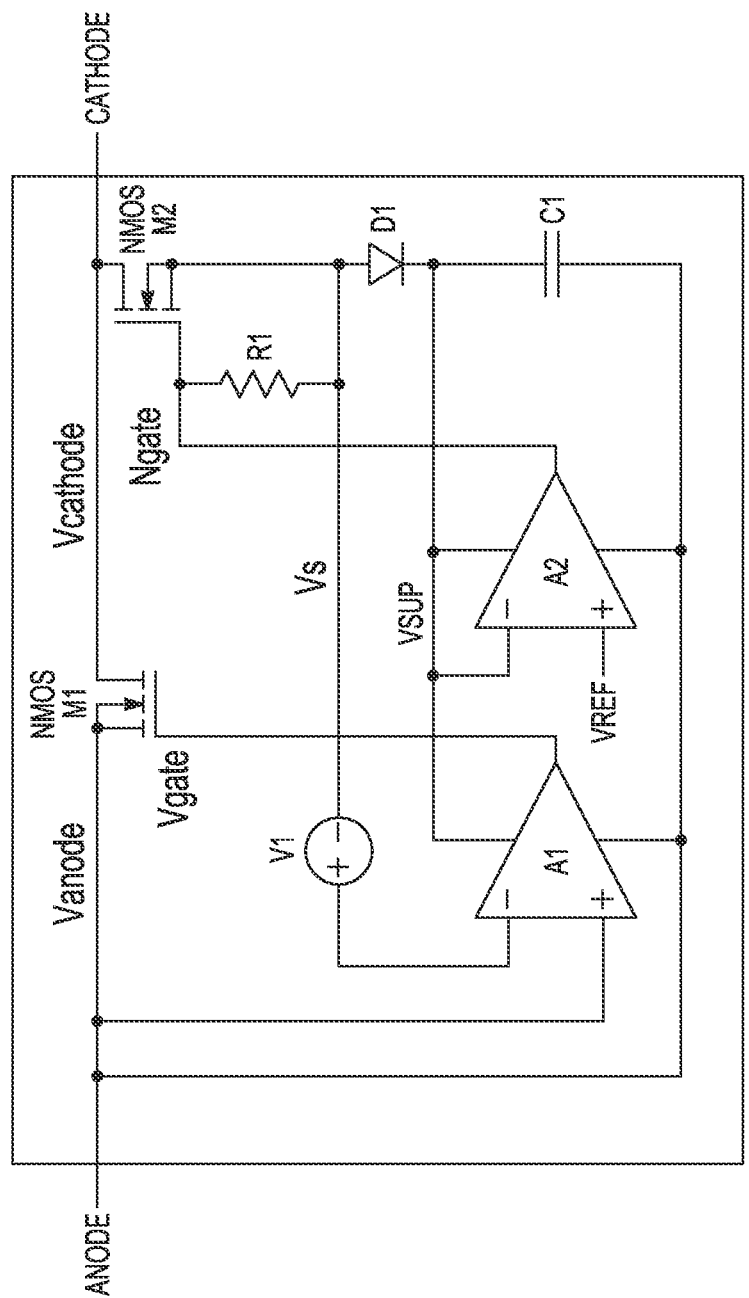
FIG. 5 is a schematic of an example of an ideal diode circuit.

In some examples, the nonlinear circuit element 308 is an integrated circuit having a circuit transfer function of an ideal diode. FIG. 5 is a circuit schematic of an example of an ideal diode circuit. The ideal diode circuit includes switch transistor M1 connected between an ANODE terminal and a CATHODE terminal. Differential amplifier A1 activates the switch transistor M1 when the voltage at the ANODE terminal is greater than the voltage at the CATHODE terminal.

Figure 6:
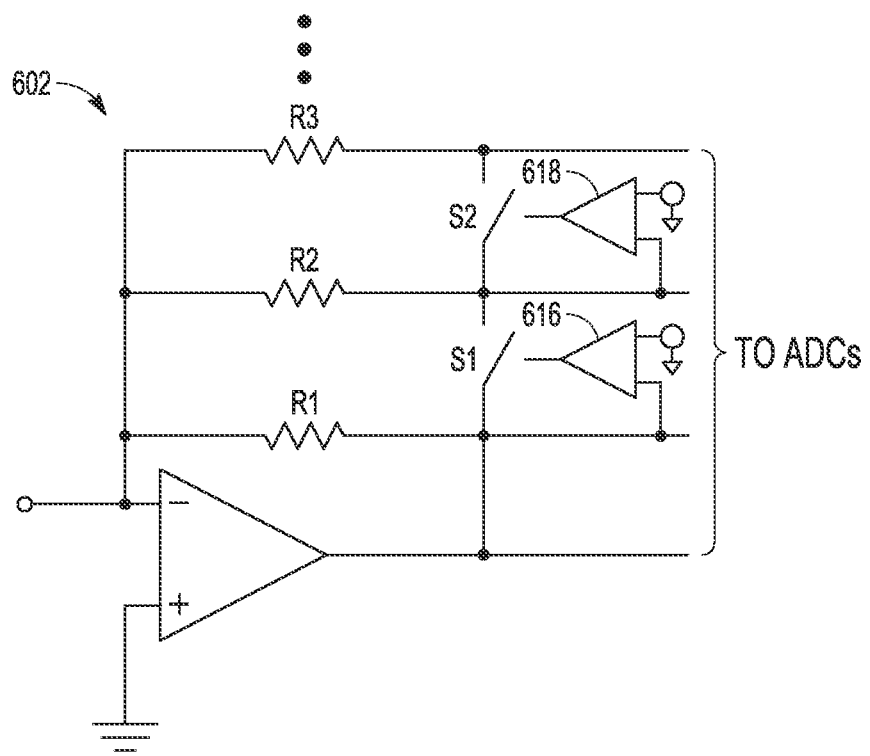
FIGS. 6 and 7 are schematics of further examples of measurement circuits to measure a signal with a large dynamic range.

In some examples, the nonlinear circuit element 308 of FIG. 3 comprises a switch circuit and a comparator circuit. FIG. 6 is a circuit schematic of a current-to-voltage converting network 602 including a switch circuit S1 and a comparator circuit 616 as the nonlinear circuit element 308 of FIG. 3. When the voltage in the amplitude of the input signal exceeds the reference voltage, the comparator circuit 616 activates the switch circuit S1 to include resistor R2 in the feedback to change the signal gain of the current-to-voltage converting network 602. This can be extended to more impedances in the feedback path. For example, one or more resistors (e.g., resistor R3) could be switched into the amplifier feedback path by a corresponding comparator (e.g., switch S2 and comparator 618) when the input signal reaches a corresponding reference voltage. The multiple switchable branches provide the ability to change the signal gain of the current-to-voltage converting network 602 at intermediate signal levels. The approach of FIG. 6 may be desirable when the input signal changes relatively slowly and predictably, and the change can be reliably detected using the comparator circuits.

Figure 7:
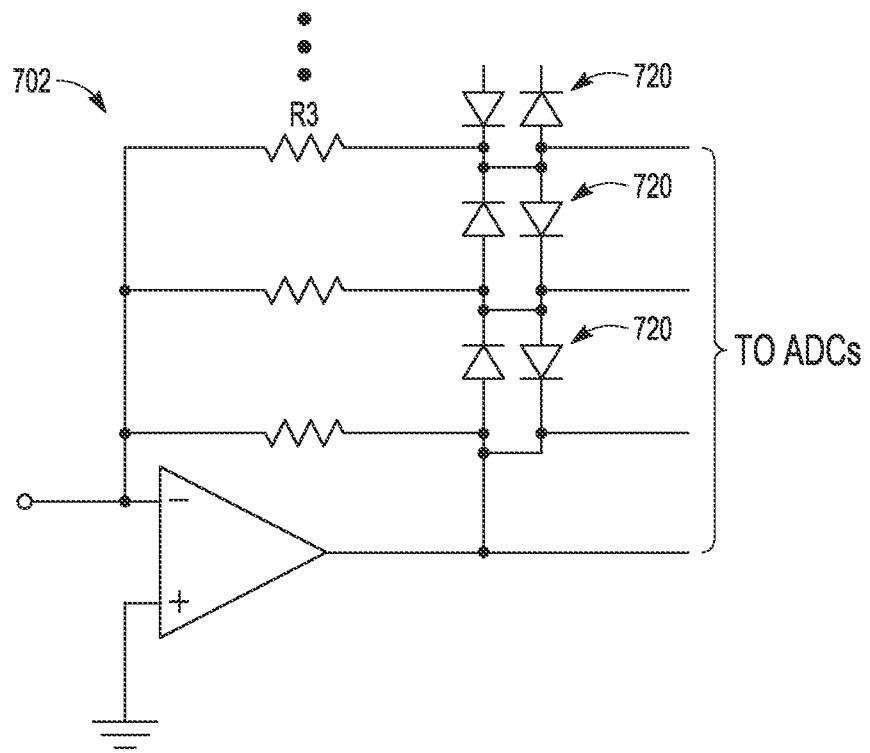

In some examples, the nonlinear circuit element 308 of FIG. 3 comprises one or more anti-parallel connected diodes. FIG. 7 is a circuit schematic of a TIA circuit 702 with an anti-parallel connected diode pair 720 as the nonlinear circuit element. The anti-parallel connected diodes 720 change the feedback path for input signals of both polarities. The impedances of multiple branches are added to the feedback path when the magnitude of the input signal is large enough to activate the diodes connected to the impedances. For example, when the input signal exceeds two diode thresholds, resistor R3 is added to the feedback of the amplifier. Like the example of FIG. 6, the multiple feedback paths provide the ability to change the gain of the current-to-voltage converting network 702 at intermediate signal levels. For either FIG. 6 or FIG. 7, the signals can be summed after quantizing by the ADC circuits as in the approach of FIG. 3 or summed before quantizing by a single ADC circuit as in the approach of FIG. 4.

Figure 8:
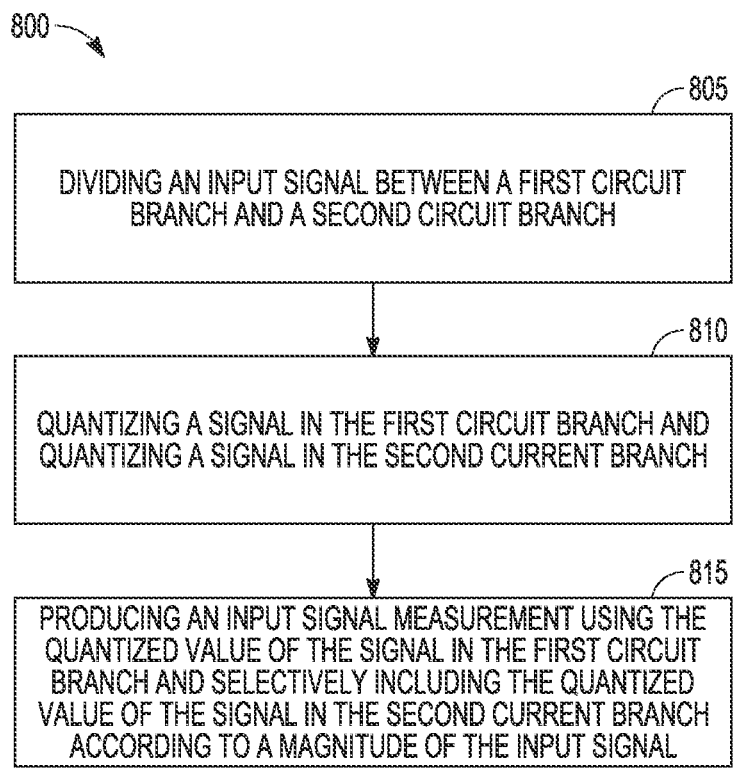
FIG. 8 is a flow diagram of a method of measuring an electrical analog signal.

For completeness, FIG. 8 is a flow diagram of a method 800 of measuring an analog electrical signal. The method 800 can be performed using the measurement circuit of the example of FIG. 3. The analog input signal may have a large dynamic range and the amplitude or magnitude of the signal may change by an order of magnitude or more. In an example intended to be non-limiting, the analog input signal may be a current signal received from a photodiode.

At block 805, an analog input signal is divided between multiple circuit branches of the measurement circuit 300. In the example of FIG. 3, two circuit branches are shown (one with resistor R1 and one with resistor R2), but the measurement circuit may include more than two circuit branches. The circuit branches are connected by a nonlinear circuit element 308.

At block 810 in FIG. 8, the signals of the circuit branches are quantized. In the example of FIG. 3, the signals are quantized using ADC circuits. At block 815, the quantized signals are selectively summed according to a magnitude of the analog input signal to quantize the analog input signal. In some examples, the quantized outputs of the ADC circuits are summed when the magnitude of the analog input signal exceeds a threshold magnitude. When the magnitude is less than the threshold, only the quantization of first circuit branch (e.g., the R1 branch in FIG. 3) is used in the result. In some examples, the quantized outputs of the ADC circuits are summed when the nonlinear circuit element connecting the circuit branches changes the signal gain (e.g., when the diode D in FIG. 3 changes the signal gain).

Alternatively, the signals of the circuit branches are summed before quantization as in the example of FIG. 4. The summation is selective based on amplitude or magnitude of the input signal. If the amplitude or magnitude is less than what is needed to change the signal gain of the amplifier, only the signal of the first circuit branch (e.g., the signal of the R1 branch in FIG. 4) is passed to the ADC circuit for quantization.

The devices, systems and methods described herein include series connected measurement channels coupled to feedback paths of an input circuit that changes signal gain based on the range of the input signal. Changing the gain of the input circuit reduces signal noise and maintains accuracy of the measurements.

ADDITIONAL DESCRIPTION AND ASPECTS

A first Aspect (Aspect 1), includes subject matter (such as a measurement circuit) comprising an input terminal to receive a current signal, a first circuit branch coupled to the first terminal and including one or more circuit elements to receive a portion of the current signal, at least a second circuit branch coupled to the first terminal and including one or more additional circuit elements to receive another portion of the current signal, a nonlinear circuit element coupling the first circuit branch to the second circuit branch, and a quantization circuit configured to produce an input current measurement of current in the first and second circuit branches and to include current in the second circuit branch in the input current measurement according to a magnitude of the input current signal.

In Aspect 2, the subject matter of Aspect 1 optionally includes a quantization circuit that includes a first analog to digital converter (ADC) circuit configured to produce a measure of current of the first circuit branch and a second ADC circuit configured to produce a measure of current of the second circuit branch. The measurement circuit is configured to include the measure produced by the second ADC circuit in the input current measurement according to the magnitude of the input current signal.

In Aspect 3, the subject matter of one or both of Aspects 1 and 2 optionally includes a current-to-voltage converting network that includes the first and second circuit branches and an amplifier circuit coupled to the nonlinear circuit element and the first and second circuit branches, and a quantization circuit that quantizes voltage output by the current-to-voltage converting network to produce the input current measurement.

In Aspect 4, the subject matter of Aspect 3 includes a nonlinear circuit element that changes the signal gain of the current-to-voltage converting network according to the magnitude of the input current signal.

In Aspect 5, the subject matter of one or any combination of Aspects 1-4 optionally includes a nonlinear circuit element that includes a diode.

In Aspect 6, the subject matter of one or any combination of Aspects 1-4 optionally includes a nonlinear circuit element that includes a diode connected MOSFET.

In Aspect 7, the subject matter of one or any combination of Aspects 1-4 optionally includes a nonlinear circuit element that includes an integrated circuit having a circuit transfer function of an ideal diode.

In Aspect 8, the subject matter of one or any combination of Aspects 1-4 optionally includes a nonlinear circuit element that includes a switch circuit and a comparator circuit, and the comparator circuit is configured to activate the switch circuit according to the magnitude of the input signal.

In Aspect 9, the subject matter of one or any combination of Aspects 1-4 optionally includes a nonlinear circuit element that includes an anti-parallel connected diode pair.

In Aspect 10, the subject matter of one or any combination of Aspects 1-9 optionally includes a photodiode connected to the input of the measurement circuit and the input signal to the measurement circuit is a current signal of the photodiode.

Aspect 11 includes subject matter (such as a method of measuring an input current signal) or can be combined with one or any combination of Aspects 1-10 to include such subject matter, comprising dividing the input current signal between a first circuit branch and a second circuit branch, the first circuit branch connected to the second circuit branch by a nonlinear circuit element, quantizing a value of current in the first circuit branch and quantizing a value of current in the second current branch, and producing an input current measurement of the input current signal using the quantized value of current in the first circuit branch and selectively including the quantized value of current in the second current branch according to a magnitude of the input current signal.

In Aspect 12, the subject matter of Aspect 11 optionally includes converting currents of the first and second circuit branches to voltages using a current-to-voltage converting network and quantizing the values of current in the first and second circuit branches using the voltages converted from the currents.

In Aspect 13, the subject matter of one or both of Aspects 11 and 12 optionally includes quantizing a value of current in the first circuit branch using a first analog to digital converter (ADC) circuit and quantizing a value of current in the second current branch using a second ADC circuit, and including the quantized value of the second ADC circuit in the input current measurement according to the magnitude of the input current signal.

In Aspect 14, the subject matter of one or any combination of Aspects 11-13 optionally includes converting currents of the first and second circuit branches to voltages using a current-to-voltage converting network that has a signal gain and changing the signal gain according to the magnitude of the input current signal.

Aspect 15 includes subject matter (such as an electronic circuit) or can optionally be combined with one or any combination of Examples 1-14 to include such subject matter, comprising a transimpedance amplifier (TIA) circuit to receive an input signal to be quantized; multiple feedback paths connected between an output of the TIA circuit and an input of the TIA circuit, including a first circuit branch that includes a first impedance and a second circuit branch that includes a second impedance connected in series with a nonlinear circuit element, wherein the nonlinear circuit element sets a signal gain of the TIA circuit according to a magnitude of the input signal; a first analog-to-digital converter (ADC) circuit, wherein an output of the first ADC circuit is used to quantize the input signal; and a second ADC circuit including an output selectively summed with the output of the first ADC circuit to quantize the input signal based on a magnitude of the input signal.

In Aspect 16, the subject matter of Aspect 15 optionally includes a photodiode to provide a current signal as the input signal to be quantized.

In Aspect 17, the subject matter of one or both of Aspects 15 and 16 optionally includes at least one other circuit branch that includes another impedance connected in series with another nonlinear circuit element; an additional ADC circuit coupled to the at least one other circuit branch; and a summing circuit configured to sum the outputs of the first and second ADC circuits with the output of the additional ADC circuit based on the magnitude of the input signal to quantize the input signal.

In Aspect 18, the subject matter of Aspect 17 optionally includes anti-parallel connected diode pairs as the nonlinear circuit elements.

In Aspect 19, the subject matter of one or any combination of Aspects 15-18 optionally includes an input of the second ADC circuit having an input impedance greater than the first impedance and the second impedance.

In Aspect 20, the subject matter of one or any combination of Aspects 15-17 optionally includes a nonlinear circuit element that is a diode.

These non-limiting Aspects can be combined in any permutation or combination. The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects. Method examples described herein can be machine or computer-implemented at least in part.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. A measurement circuit to measure a current signal, the measurement circuit comprising:
an input terminal to receive the current signal;
a first circuit branch coupled to the first terminal and including one or more circuit elements to receive a portion of the current signal, and at least a second circuit branch coupled to the first terminal and including one or more additional circuit elements to receive another portion of the current signal;
a nonlinear circuit element coupling the first circuit branch to the second circuit branch;
a quantization circuit configured to produce an input current measurement of current in the first and second circuit branches, and to include current in the second circuit branch in the input current measurement according to a magnitude of the input current signal; and
wherein the nonlinear circuit element includes a switch circuit and a comparator circuit, and the comparator circuit is configured to activate the switch circuit according to the magnitude of the input signal.

2. The measurement circuit of claim 1, wherein the quantization circuit includes a first analog to digital converter (ADC) circuit configured to produce a measure of current of the first circuit branch and a second ADC circuit configured to produce a measure of current of the second circuit branch, and the measurement circuit is configured to include the measure produced by the second ADC circuit in the input current measurement according to the magnitude of the input current signal.

3. The measurement circuit of claim 1, including a current-to-voltage converting network that includes the first and second circuit branches and an amplifier circuit coupled to the nonlinear circuit element and the first and second circuit branches, and wherein the quantization circuit quantizes voltage output by the current-to-voltage converting network to produce the input current measurement.

4. The measurement circuit of claim 3, wherein the current-to-voltage converting network has signal gain, and the nonlinear circuit element changes the signal gain according to the magnitude of the input current signal.

5. The measurement circuit of claim 1, wherein the nonlinear circuit element includes a diode.

6. The measurement circuit of claim 1, wherein the nonlinear circuit element includes a diode connected metal oxide semiconductor field effect transistor (MOSFET).

7. The measurement circuit of claim 1, wherein the nonlinear circuit element includes an integrated circuit having a circuit transfer function of an ideal diode.

8. The measurement circuit of claim 1, wherein the nonlinear circuit element includes an anti-parallel connected diode pair.

9. The measurement circuit of claim 1, including a photodiode connected to the input of the measurement circuit and the input signal to the measurement circuit is a current signal of the photodiode.

10. A method of measuring an input current signal, the method comprising:
dividing the input current signal between a first circuit branch and a second circuit branch, the first circuit branch connected to the second circuit branch by a nonlinear circuit element that includes a switch circuit and a comparator circuit;
quantizing a value of current in the first circuit branch and quantizing a value of current in the second current branch; and
producing an input current measurement of the input current signal using the quantized value of current in the first circuit branch and selectively including the quantized value of current in the second current branch by the comparator circuit activating the switch circuit according to a magnitude of the input current signal.

11. The method of claim 10, including:
converting currents of the first and second circuit branches to voltages using a current-to-voltage converting network; and
quantizing the values of current in the first and second circuit branches using the voltages converted from the currents.

12. The method of claim 10, including:
quantizing a value of current in the first circuit branch using a first analog to digital converter (ADC) circuit;
quantizing a value of current in the second current branch using a second ADC circuit; and
including the quantized value of the second ADC circuit in the input current measurement according to the magnitude of the input current signal.

13. The method of claim 10, including:
converting currents of the first and second circuit branches to voltages using a current-to-voltage converting network that has a signal gain; and
changing the signal gain according to the magnitude of the input current signal.

14. An electronic circuit comprising:
a transimpedance amplifier (TIA) circuit to receive an input signal to be quantized;
multiple feedback paths connected between an output of the TIA circuit and an input of the TIA circuit, including a first circuit branch that includes a first impedance and a second circuit branch that includes a second impedance connected in series with a nonlinear circuit element, wherein the nonlinear circuit element sets a signal gain of the TIA circuit according to a magnitude of the input signal;
a first analog-to-digital converter (ADC) circuit, wherein an output of the first ADC circuit is used to quantize the input signal; and
a second ADC circuit including an output selectively summed with the output of the first ADC circuit to quantize the input signal based on a magnitude of the input signal;
at least one other circuit branch that includes another impedance connected in series with another nonlinear circuit element;
an additional ADC circuit coupled to the at least one other circuit branch; and
a summing circuit configured to sum the outputs of the first and second ADC circuits with the output of the additional ADC circuit based on the magnitude of the input signal to quantize the input signal.

15. The electronic circuit of claim 14, including a photodiode to provide a current signal as the input signal to be quantized.

16. The electronic circuit of claim 14, wherein the nonlinear circuit element and the other nonlinear circuit element are anti-parallel connected diode pairs.

17. The electronic circuit of claim 14, wherein an input of the second ADC circuit has an input impedance greater than the first impedance and the second impedance.

18. The electronic circuit of claim 14, wherein the nonlinear circuit element is a diode.

* * * * *